(12) United States Patent
Liu et al.

(10) Patent No.: US 10,314,167 B2
(45) Date of Patent: Jun. 4, 2019

(54) DEVICE FOR BENDING SHEET, LED MODULE AND DISPLAY SCREEN

(71) Applicant: SHENZHEN INFILED ELECTRONICS Co., Ltd., Shenzhen (CN)

(72) Inventors: Qiuhe Liu, Shenzhen (CN); Yang Guo, Shenzhen (CN); Rihao Hu, Shenzhen (CN)

(73) Assignee: SHENZHEN INFILED ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/993,728

(22) Filed: May 31, 2018

(65) Prior Publication Data

US 2018/0279469 A1    Sep. 27, 2018

Related U.S. Application Data

(63) Continuation-in-part of application No. PCT/CN2017/101263, filed on Sep. 11, 2017.

(30) Foreign Application Priority Data

Jan. 24, 2017    (CN) .................... 2017 2 0100853 U (51) Int. Cl.
*H05K 1/02*    (2006.01)
*H05K 1/18*    (2006.01)
(Continued)

(52) U.S. Cl.
CPC ......... *H05K 1/0281* (2013.01); *F21V 19/005* (2013.01); *H05K 1/0277* (2013.01);
(Continued)

(58) Field of Classification Search
CPC ........ H05K 1/0281; H05K 3/00; H05K 1/189; H05K 2201/10106; H05K 2201/10128;
(Continued)

(56) References Cited

U.S. PATENT DOCUMENTS

2007/0035938 A1    2/2007 Rochford et al.
2015/0257289 A1*   9/2015 Lee ...................... H05K 5/0017
                                                                361/749
(Continued)

FOREIGN PATENT DOCUMENTS

CN    201294678 Y    8/2009
CN    104465529 A    3/2015
(Continued)

*Primary Examiner* — Tracie Y Green
(74) *Attorney, Agent, or Firm* — Gokalp Bayramoglu (57) ABSTRACT

A device for bending sheets includes a first abutting member and a second abutting member fixedly connected to an outside surface of the sheet. The second abutting member is rotatably connected to the first abutting member. A rotating position and a locking position are provided at the connection between the first abutting member and the second abutting member. The first abutting member and the second abutting member are capable of rotating relative to each other at the rotating position, and the first abutting member and the second abutting member are capable of being interlocked with each other at the locking position. The first abutting member and the second abutting member are interlocked so as to obtain a desired curvature of the sheet. The present invention further provides an LED module and a display screen.

16 Claims, 4 Drawing Sheets (51) Int. Cl.
*F21V 19/00* (2006.01)
*H05K 3/00* (2006.01)
*F21Y 115/10* (2016.01)

(52) U.S. Cl.
CPC .......... *H05K 1/0284* (2013.01); *H05K 1/189* (2013.01); *H05K 3/0058* (2013.01); *F21Y 2115/10* (2016.08); *H05K 2201/09018* (2013.01); *H05K 2201/10106* (2013.01); *H05K 2201/10128* (2013.01); *H05K 2201/10522* (2013.01)

(58) Field of Classification Search
CPC ............ H05K 2201/10522; G09F 9/33; F21V 19/005; F21Y 2115/10
See application file for complete search history.

(56) References Cited

U.S. PATENT DOCUMENTS

2016/0075588 A1* 3/2016 Olivier .................. C03B 23/027 65/361
2016/0085265 A1* 3/2016 Park ...................... G06F 1/1681 361/807

FOREIGN PATENT DOCUMENTS

| | | |
|---|---|---|
| CN | 104797075 A | 7/2015 |
| CN | 205160921 U | 4/2016 |
| JP | 2002047599 A | 2/2002 |
| JP | 2004235228 A | 8/2004 |

* cited by examiner

DEVICE FOR BENDING SHEET, LED MODULE AND DISPLAY SCREEN

CROSS REFERENCE TO RELATED APPLICATIONS

This non-provisional patent application is a Continuation-in-part of International Application No. PCT/CN2017/101263, filed on Sep. 11, 2017, which is based upon and claims priority to Chinese Application No. 201720100853.1, filed on Jan. 24, 2017. These two applications are incorporated herein by reference.

TECHNICAL FIELD

The present invention relates to the field of bending devices for bending sheets, and in particular to a device for bending sheets and an LED module with devices for bending sheets and a display screen with an LED module.

BACKGROUND

In the process of using an electronic device, a printed circuit board which is made of hard material withstanding a limited bending angle is generally bended with the help of devices so as to meet the requirement of the structural or functional diversity. The traditional devices are usually fixing devices for directly fixing a sheet or bending members connected together by soft material, therefore the bending degree is not enough or the bending angle is not easily controlled which results in damaging the sheet.

SUMMARY

Thus, there is a desire for device for bending sheets and an LED module with device for bending sheets and a display screen with an LED module, so as to solve the problems in the prior art that the device has insufficient bending angle or the bending angle is not easily controlled which results in damaging the sheets.

The objective of the present embodiment is achieved by the following technical solutions:

A device for bending a sheet which comprises a first outside surface and a second outside surface opposite to the first outside surface, the device comprising at least two abutting members fixed to at least two portions of one of the outside surfaces of the sheet, an angle being formed between the at least two abutting members, wherein the at least two abutting members are moveable relative to each other so that the angle is adjustable between a desired range and the at least two portions of the sheet is bent accordingly.

Preferably, the at least two abutting members are respectively defined as a first abutting member and a second abutting member; the first abutting member is fixedly connected to the second outside surface of the sheet, the second abutting member is fixedly connected to the second outside surface of the sheet and is rotatably connected to the first abutting member. A rotating position and a locking position are provided at the connection of the first abutting member and the second abutting member, the first abutting member and the second abutting member are capable of rotating relative to each other at the rotating position, and the first abutting member and the second abutting member are capable of being interlocked with each other at the locking position so as to obtain a desired curvature of the sheet.

Preferably, the first abutting member comprises a first abutting plate fixedly connected to the second outside surface of the sheet and a first adjusting component disposed on the first abutting plate; the second abutting member comprises a second abutting plate fixedly connected to the second outside surface of the sheet and a second adjusting component disposed on the second abutting plate. The first adjusting component is rotatably connected to the second adjusting component, both the rotating position and the locking position are formed at the connection of the first adjusting component and the second adjusting component.

Preferably, both the first adjusting component and the second adjusting component are in the shape of "E".

Preferably, the first adjusting component is provided with a first locking protrusion, the second adjusting component is provided with a first locking slot corresponding to the first locking protrusion, the first adjusting component is rotatably connected to the second adjusting component by the connection of the first locking protrusion and the first locking slot, a first engaging surface is provided at an end of the first locking protrusion connecting with the first locking slot, a second engaging surface corresponding to the first engaging surface is provided on the second adjusting component located within the first locking slot, and the mutual rotation and locking between the first adjusting component and the second adjusting component are achieved by engagement of the first engaging surface and the second engaging surface.

Preferably, the first adjusting component further comprises a second locking slot, the second adjusting component comprises a second locking protrusion corresponding to the second locking slot, and the first adjusting component is rotatably connected to the second adjusting component respectively by the locking-fit connection of the first locking protrusion and the first locking slot, as well as the locking-fit connection of the second locking slot and the second locking protrusion;

A third engaging surface is provided at an end of the second locking protrusion connecting with the second locking slot, a fourth engaging surface corresponding to the third engaging surface is provided on a portion of the first adjusting component located within the second locking slot, and the mutual rotation and locking between the first adjusting component and the second adjusting component are achieved respectively by engagement of the first engaging surface and the second engaging surface, as well as engagement of the third engaging surface and the fourth engaging surface.

Preferably, both the first locking protrusion and the second locking protrusion are in the shape of "T".

Preferably, the first adjusting component and the first abutting plate are integrally formed as a single part, and the second adjusting component and the second abutting plate are integrally formed as a single part.

Preferably, a positioning component is arranged on the second outside surface of the sheet, a mounting hole corresponding to the positioning component is arranged on the abutting member, the abutting member is fixedly connected to the second outside surface of the sheet by engagement of the mounting hole and the positioning component.

Preferably, the device further comprises a locking component for locking both the sheet and the abutting member, and an end of the positioning component passing through the mounting hole is connected to the locking component and abuts against the abutting member.

Preferably, an end of the positioning component passing through the mounting hole is provided with a threaded section, and the locking component is a screw threadably connected to the threaded section.

Preferably, the device further comprises a connecting structure for connecting with another sheet, and the connecting structure is disposed on the abutting member.

Preferably, the connecting structure comprises:

a connecting installation slot, the connecting installation slot is disposed on the abutting member;

a connecting component, the connecting component being rotatably disposed in the connecting installation slot, and the connecting component comprising a connecting portion rotatably protruding from the connecting installation slot and a holding portion connected to the connecting portion;

a fixing component, an end of the fixing component being connected to the connecting component, and the other end of the fixing component is connected to the abutting member so that the connecting component being fixedly arranged in the connecting installation slot;

a connecting part, the connecting part being disposed on the abutting member corresponding to another sheet for connection with the connecting part.

Preferably, the device comprises at least three abutting members, and the width of the middle abutting member is equal to the sum of the width of the abutting members located on both sides.

Preferably, the device comprises at least four abutting members, and the width of the middle abutting members is equal to the sum of the width of the abutting members located on both sides, and the middle abutting members have the same width.

The present invention further relates to an LED module comprising a PCB, LEDs, a mask and any one of the above device. The PCB comprises a first outside surface and a second outside surface opposite to the first outside surface; the LEDs are disposed on a first outside surface of the PCB; the mask is disposed on the first outside surface of the PCB and covers the PCB and the lateral sides of the LEDs; and the first abutting member and the second abutting member are both fixedly disposed on the second outside surface of the PCB.

Preferably, the PCB is fixed on the abutting members by glue or hooks or any other traditional means.

Compared with the prior art, the present invention has the beneficial effects that: the first abutting member and the second abutting member are capable of mutually rotating and being locked so as to obtain the required curvature of the sheet and hardly damage the sheet.

DETAILED DESCRIPTION

Below, embodiments of the present invention will be described in greater detail with reference to the drawings.

Figure 1:
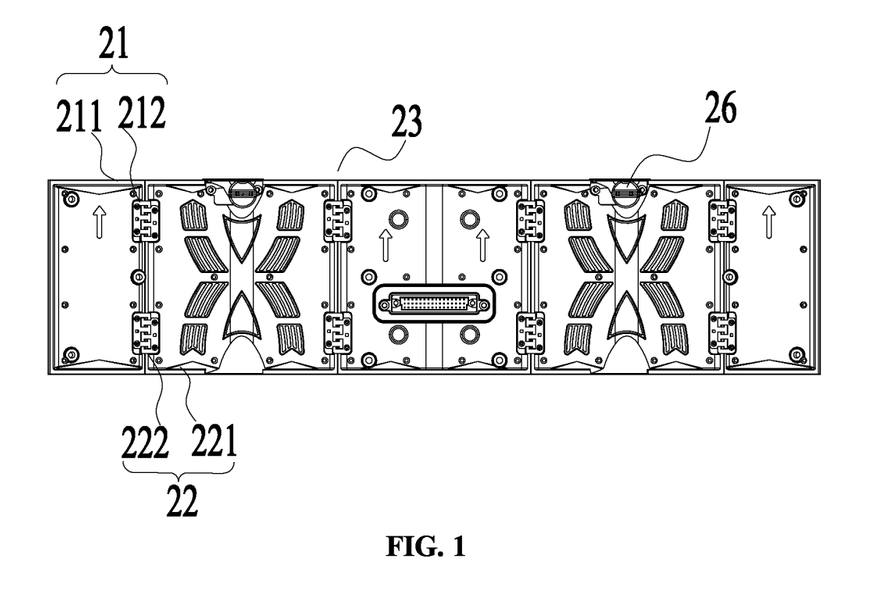
FIG. 1 is a schematic structural view of an device for bending sheets according to an embodiment of the present disclosure.
Figure 2:
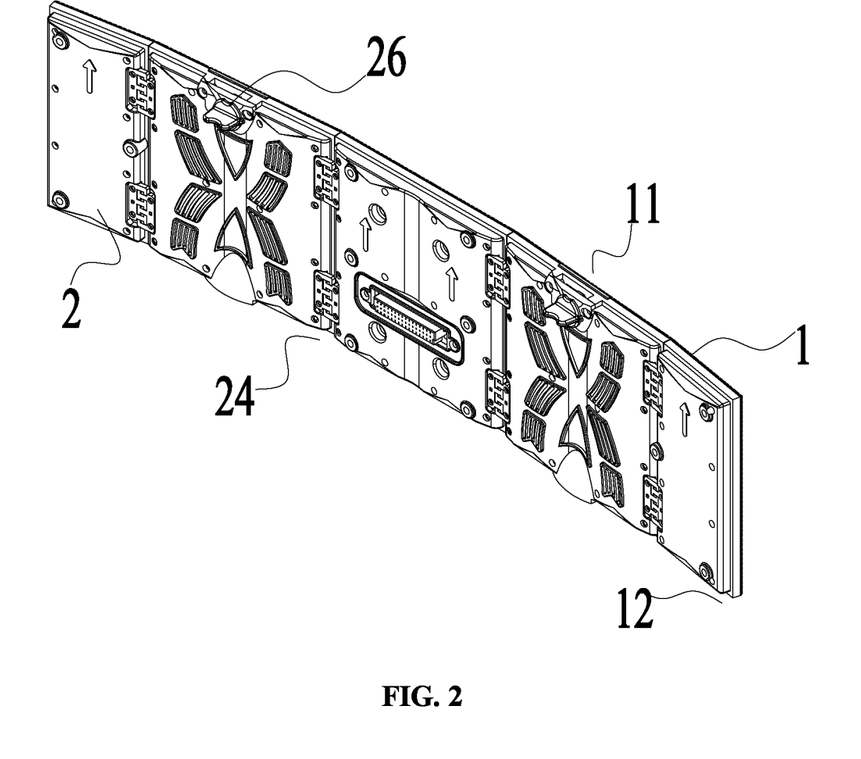
FIG. 2 is a schematic structural view of an LED module with the device for bending sheets of FIG. 1.

As shown in FIG. 1 to FIG. 2, an embodiment of the present invention provides a device 2 for bending a sheet 1 which may be a PCB (printed circuit board) used in the field of electronic technology or a sheet used in other technical fields. The sheet 1 includes a first outside surface 11 and a second outside surface 12 opposite to the first outside surface 11. The device 2 includes at least two abutting members. Preferably, the width of the middle abutting members is equal to the sum of the width of the abutting members located on both sides. When the PCB with LEDs mounted thereon is connected with the device 2, the width of each of the middle abutting members corresponds to the width of an LED display sub-area, and the width of the LED display sub-area is equal to the sum of the width of the abutting members located on both sides. In the present embodiment, the number of the abutting members is five, the width of the three middle abutting members are the same, the width of the two abutting members located at both sides are the same. The sum of the width of two abutting members located on the side of the device 2 equals to the width of the LED display sub-area when at least two devices 2 are connected together, so as to form a desired arc display screen. Of course, it is also possible to provide other number of abutting members according to the actual situation, for example, the number of abutting members may be three, four, six or seven, etc., and such implementation manners also fall into the protection scope of the present embodiment. In addition, it is noted that, in order to clearly and briefly describe the specific structure of the device 2, only two of the abutting members are described in the following detailed description of the embodiment. It is understood that the device 2 includes but is not limited to two abutting members.

Wherein the two abutting members are respectively defined as a first abutting member 21 and a second abutting member 22. The first abutting member 21 is fixedly connected to the second outside surface 12 of the sheet 1. The second abutting member 22 is fixedly connected to the second outside surface 12 of the sheet 1 and is rotatably connected to the first abutting member 21. A rotating position 23 and a locking position 24 are provided at the connection of the first abutting member 21 and the second abutting member 22, the first abutting member 21 and the second abutting member 22 are capable of rotating relative to each other at the rotating position 23 and the first abutting member 21 and the second abutting member 22 are capable of being interlocked with each other at the locking position 24. The first abutting member 21 and the second abutting member 22 are interlocked so as to obtain a desired curvature of the sheet 1.

The sheet 1 is able to obtain a desired curvature by changing the rotation angle formed between the first abutting member 21 and the second abutting member 22. The locking position 24 is provided between the first abutting member 21 and the second abutting member 22 and therefore the maximum curvature can be limited so as to avoid damage of the sheet 1 resulted from erroneous operation.

The first abutting member 21 comprises a first abutting plate 211 fixedly connected to the second outside surface 12 of the sheet 1 and a first adjusting component 212 disposed on the first abutting plate 211. The second abutting member 22 comprises a second abutting plate 221 fixedly connected to the second outside surface 12 of the sheet 1 and a second adjusting component 222 disposed on the second abutting plate 221. The first adjusting component 212 is rotatably connected to the second adjusting component 222, both the rotating position 23 and the locking position 24 are formed at the connection of the first adjusting component 212 and the second adjusting component 222. The first abutting member 21 is mainly composed of the first abutting plate 211 and the first adjusting component 212 and the second abutting member 22 is mainly composed of the second abutting plate 221 and the second adjusting component 222, which accordingly, in addition to simplifying the structure, easy processing, but also is beneficial to adjust the curvature of the sheet 1. Specifically, the first adjusting component 212 is rotatably connected to the second adjusting component 222 so that the curvature of the sheet 1 is smoother.

Preferably, in order to ensure the stability of the device and the uniformity of the load-bearing of the sheet, and avoid material waste, the number of the first adjusting component 212 and the second adjusting component 222 is two. Of course, the number of the first adjusting component 212 and the second adjusting component 222 may also be set to three, four, five, etc, and such implementation manners also fall into the protection scope of the present embodiment.

Figure 3:
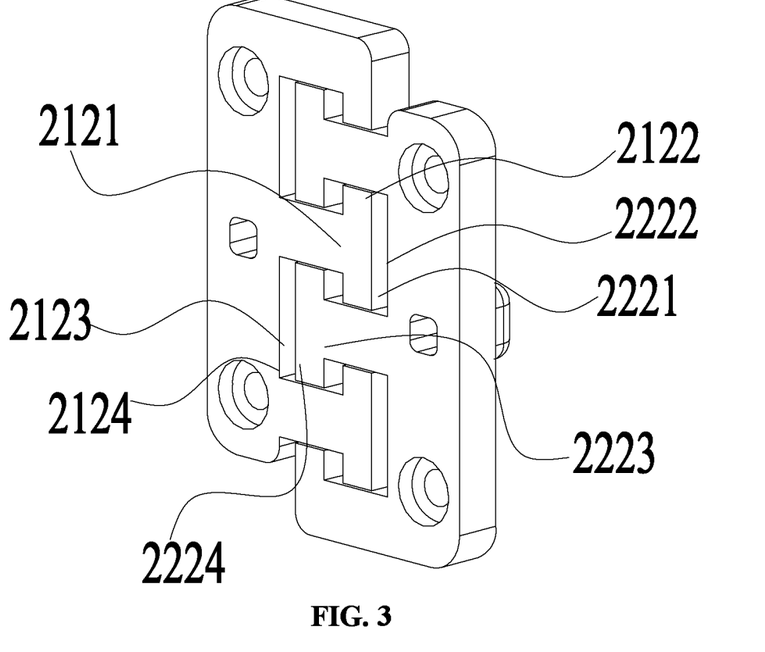
FIG. 3 is a schematic structural view of the first adjusting component and the second adjusting component of the device for bending sheets of FIG. 1.

Specifically, as shown in FIG. 3, the first adjusting component 212 is provided with a first locking protrusion 2121, the second adjusting component 222 is provided with a first locking slot 2221 corresponding to the first locking protrusion 2121, and the first adjusting component 212 is rotatably connected to the second adjusting component 222 by the connection of the first locking protrusion 2121 and the first locking slot 2221. A first engaging surface 2122 is provided at an end of the first locking protrusion 2121 connecting with the first locking slot 2221, a second engaging surface 2222 corresponding to the first engaging surface 2122 is provided on the second adjusting component 222 located within the first locking slot 2221 locking, and the mutual rotation and locking between the first adjusting component 212 and the second adjusting component 222 are achieved by engagement of the first engaging surface 2122 and the second engaging surface 2222. The rotation angle formed between the first adjusting component 212 and the second adjusting component 222 can be conveniently adjusted so as to obtain a desired curvature of the sheet 1. Furthermore, the lock between the first adjusting component 212 and the second adjusting component 222 can be easily and conveniently unlocked, as long as the first adjusting component 212 and the second adjusting component 222 are loosened in a direction toward the rotating position 23. Preferably, the first adjusting component 212 and the first abutting plate 211 are integrally formed as a single part, and the second adjusting component 222 and the second abutting plate 221 are integrally formed as a single part so as to be used without disassembly and reduce costs.

Moreover, the first adjusting component 212 comprises a second locking slot 2123, the second adjusting component 222 comprises a second locking protrusion 2223 corresponding to the second locking slot 2123, and the first adjusting component 212 is rotatably connected to the second adjusting component 222 respectively by the locking connection of the first locking protrusion 2121 and the first locking slot 2221, as well as the locking connection of the second locking slot 2123 and the second locking protrusion 2223. A third engaging surface 2224 is provided at an end of the second locking protrusion 2223 connecting with the second locking slot 2123, a fourth engaging surface 2124 corresponding to the third engaging surface 2224 is provided on a portion of the first adjusting component 212 located within the second locking slot 2123, and the mutual rotation and locking between the first adjusting component 212 and the second adjusting component 222 are achieved respectively by engagement of the first engaging surface 2122 and the second engaging surface 2222, as well as engagement of the third engaging surface 2224 and the fourth engaging surface 2124. Specifically, the first adjusting component 212 and the second adjusting component 222 are interlocked with each other. The rotation angle reaches a maximum value when one of two sides in the width direction of the first engaging surface 2122 of the first adjusting component 212 contacts with the second engaging surface 2222 of the second adjusting component 222, which results in the maximum curvature between the first abutting member 21 and the second abutting member 22 being limited so as to avoid damage of the sheet 1 resulted from erroneous operation or excessive bend.

Further, both the first adjusting component 212 and the second adjusting component 222 are in the shape of "E". Both the first locking protrusion 2121 and the second locking protrusion 2223 are in the shape of "T", which results in the first adjusting component 212 and the second adjusting component 222 being mutually rotatable and being limited in the width direction of the device 2 at the same time.

Preferably, the number of the first locking protrusion 2121, the first locking slot 2221, the second locking protrusion 2223, and the second locking slot 2123 can be set as more than one, for example, two, three, four, or five, etc., and such implementation manners also fall into the protection scope of the present embodiment, whereby the first adjusting component 212 and the second adjusting component 222 can be better locked.

Figure 4:
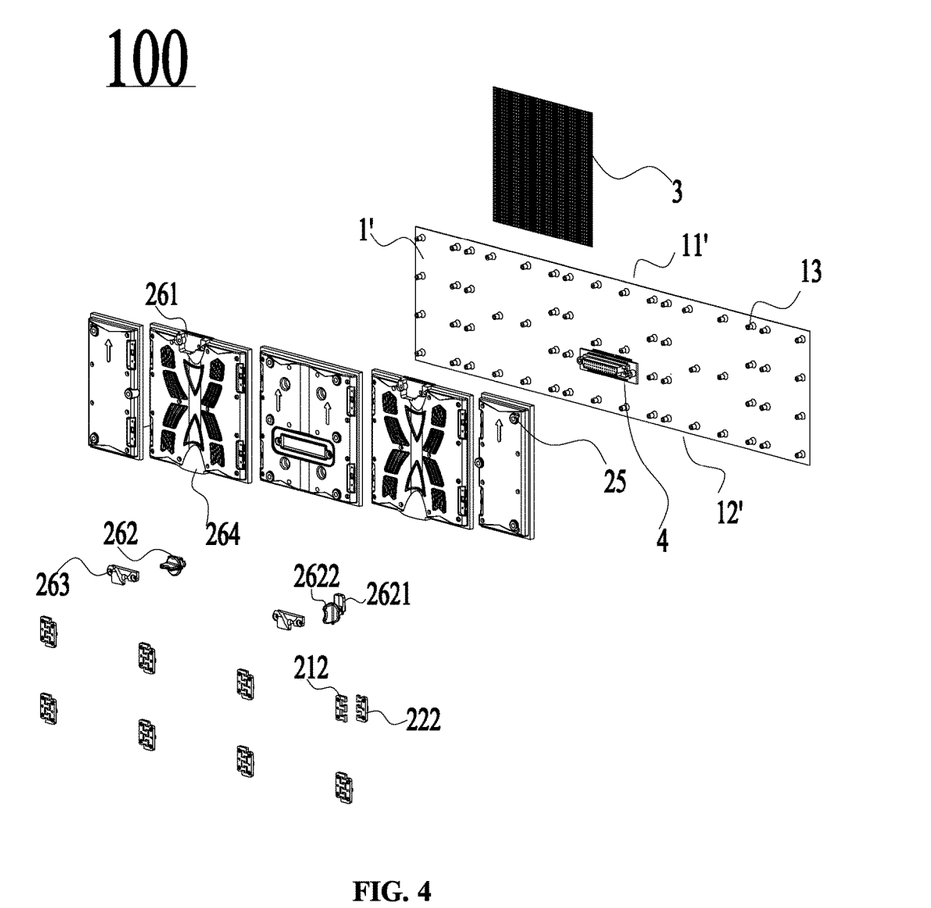
FIG. 4 is an exploded view of the LED module of FIG. 2.

FIG. 4 shows another embodiment of the present invention containing the implementation content of the above embodiment. In the present embodiment, a positioning component 13 is arranged on the second outside surface 12 of the sheet 1, a mounting hole 25 corresponding to the positioning component 13 is arranged on the abutting member, wherein the abutting member is the first abutting member 21 and/or the second abutting member 22. The abutting member is fixedly connected to the second outside surface 12 of the sheet 1 by engagement of the mounting hole 25 and the positioning component 13. Preferably, the positioning component 13 can be set as more than one, and the mounting hole 25 can be correspondingly set as more than one. Therefore, the abutting member could be more firmly and reliably mounted on the sheet 1 by engagement of the more than one positioning components 13 and more than one mounting holes 25. Moreover, the abutting members may be fixed on the sheet 1 by any other means such as but not limited to glue or hooks.

Preferably, the device 2 further comprises a locking component for locking (not shown in the figure) both the sheet 1 and the abutting member, and an end of the positioning component 13 passing through the mounting hole 25 is connected to the locking component and abuts against the abutting member.

Preferably, an end of the positioning component 13 passing through the mounting hole 25 is provided with a threaded section, and the locking component is a screw threadably connected to the threaded section.

As shown in FIG. 1 to FIG. 4, the device 2 further comprises a connecting structure 26 for connecting with another sheet, and the connecting structure 26 is disposed on the abutting member.

Preferably, the connecting structure 26 comprises:
a connecting installation slot 261, the connecting installation slot 261 being disposed on the abutting member;
a connecting component 262, the connecting component 262 being rotatably disposed in the connecting installation slot 261, and the connecting component 262 comprising a connecting portion 2621 rotatably protruding from the connecting installation slot 261 and a holding portion 2622 connected to the connecting portion 2621;

a fixing component 263, an end of the fixing component 263 being connected to the connecting component 262, and the other end of the fixing component 263 being connected to the abutting member so that the connecting component 262 is fixedly arranged in the connecting installation slot 261;

a connecting part 264, the connecting part 264 being disposed on the abutting member corresponding to another sheet for connection with the connecting portion 2621.

Refer to FIG. 4, the present invention also relates to an LED module 100 comprising a PCB 1', an LEDs, a mask 3 and the above-described device 2. The PCB 1' comprises a first outside surface 11' and a second outside surface 12' opposite to the first outside surface 11'; the LEDs is disposed on the first outside surface 11' of the PCB 1'; the mask 3 is disposed on a first outside surface 11' of the PCB 1' and covers the PCB 1' and the lateral sides of the LEDs; the first abutting member 21 and the second abutting member 22 are both fixedly disposed on the second outside surface 12' of the PCB 1'.

Since the LED module 100 comprises the device 2, N pieces of abutting members can be used, wherein 10≥N≥2 and N is an integer, so that the PCB 1' is bent. When the PCB 1' with the LEDs are connected to the device 2 and 10≥N≥3, the width of each of the middle abutting members corresponds to the width of a LED display sub-area, and the width of the LED display sub-area is equal to the sum of the width of the abutting members located on both sides. The PCB 1' is made of a thin material and the relative position of the adjacent abutting members can be adjusted so that the device 2 can achieve a desired arc effect. The PCB 1' of the above-described LED module 100 is fixedly connected to the abutting members, and the connection of two adjacent abutting members is close to a curved surface and the first outside surface 11' of the PCB 1' is correspondingly close to a curved surface, the point space formed between two adjacent LEDs at the connection of the abutting members is minimally changed, and the display surface of the LEDs disposed on the first outside surface 11' of the PCB 1' is closest to a curved surface so as to achieve the best curved display. Moreover, an angle is formed between two adjacent abutting members of the LED module 100. The angle has a maximal value in two following positions. The first position is when one side edge of the first engaging surface 2122 in the width direction thereof contacts with the second engaging surface 2222. The second position is when the opposite side edge of the first engaging surface 2122 in the width direction thereof contacts with the second engaging surface 2222. Therefore, the two adjacent abutting members of the LED module 100 can be adjustable between the above two positions so as to obtain a desired shape of the LED module 100, for example, be concaved or convex to a desired shape. Furthermore, a mounting part is arranged on the abutting member, the LED module 100 is fixedly connected to the frame of a display screen by engagement of the mounting part and a locking element of the frame. Therefore, the LED module 100 is easy to be installed and suitable to different occasions. Preferably, the mounting part is a screw hole, and the locking element is a screw. Besides, the number of the mounting part and the locking element can be more than one.

Moreover, the LED module 100 further includes a data interface 4 disposed on the PCB 1' so as to facilitate the data transmission. Preferably, the number of data interface 4 is one, and the single data interface 4 is disposed at a position below the middle of the PCB 1' so as to be convenient for installation and maintenance. Meanwhile, the above single data interface 4 can also be made fool-proof so that it is not easy to be installed reversely. The PCB 1' could be fixed on the abutting members can be fixed to the abutting members by any means such as but not limited to by glue or hooks.

A person skilled in the art may make various other corresponding changes and deformations based on the described technical solutions and concepts. And all such changes and deformations shall also fall within the scope of the present invention.

The invention claimed is:

1. A device for bending a sheet which comprises a first outside surface and a second outside surface opposite to the first outside surface, comprising:
    at least two abutting members fixed to at least two first portions of the first outside surface of the sheet or fixed to at least two second portions of the second outside surface of the sheet;
    an angle formed between the at least two abutting members; wherein
    the at least two abutting members are moveable relative to each other such that the angle is adjustable between a desired range, and the at least two first portions or the at least two second portions are bent according to the angle,
    wherein the at least two abutting members comprise a first abutting member and a second abutting member; the first abutting member is fixedly connected to the second outside surface of the sheet, the second abutting member is fixedly connected to the second outside surface of the sheet, and the second abutting member is rotatably connected to the first abutting member; and
    wherein a rotating position and a locking position are provided at a connection of the first abutting member and the second abutting member, the first abutting member and the second abutting member are capable of rotating relative to each other at the rotating position, and the first abutting member and the second abutting member are capable of being interlocked with each other at the locking position so as to obtain a desired curvature of the sheet.

2. The device of claim 1, wherein the first abutting member comprises a first abutting plate and a first adjusting component, the first abutting plate is fixedly connected to the second outside surface of the sheet, and the first adjusting component is disposed on the first abutting plate; the second abutting member comprises a second abutting plate and a second adjusting component, the second abutting plate is fixedly connected to the second outside surface of the sheet, and the second adjusting component is disposed on the second abutting plate;
    the first adjusting component is rotatably connected to the second adjusting component, both the rotating position and the locking position are formed at a connection of the first adjusting component and the second adjusting component.

3. The device of claim 2, wherein both the first adjusting component and the second adjusting component are in a shape of "E".

4. The device of claim 2, wherein the first adjusting component is provided with a first locking protrusion, the second adjusting component is provided with a first locking slot, the first locking slot corresponds to the first locking protrusion, the first adjusting component is rotatably connected to the second adjusting component by a connection of the first locking protrusion and the first locking slot;
    a first engaging surface is provided at an end of the first locking protrusion, the first locking protrusion is connected with the first locking slot, a second engaging surface is provided on a portion of the second adjusting component, the second engaging surface corresponds to the first engaging surface, the second adjusting component is located within the first locking slot, and mutual rotation and locking between the first adjusting component and the second adjusting component are achieved by an engagement of the first engaging surface and the second engaging surface.

5. The device of claim 4, wherein the first adjusting component further comprises a second locking slot, the second adjusting component comprises a second locking protrusion, the second locking protrusion corresponds to the second locking slot, and the first adjusting component is rotatably connected to the second adjusting component respectively by the connection of the first locking protrusion and the first locking slot and a connection of the second locking slot and the second locking protrusion;

a third engaging surface is provided at an end of the second locking protrusion, the second locking protrusion is connected with the second locking slot, a fourth engaging surface is provided on a portion of the first adjusting component, the fourth engaging surface corresponds to the third engaging surface, the first adjusting component is located within the second locking slot, and the mutual rotation and locking between the first adjusting component and the second adjusting component are achieved respectively by the engagement of the first engaging surface and the second engaging surface and an engagement of the third engaging surface and the fourth engaging surface.

6. The device of claim 5, wherein both the first locking protrusion and the second locking protrusion are in a shape of "T".

7. The device of claim 2, the first adjusting component and the first abutting plate are integrally formed as a first single part, and the second adjusting component and the second abutting plate are integrally formed as a second single part.

8. The device of claim 1, wherein a positioning component is arranged on the second outside surface of the sheet, a mounting hole is arranged on the first abutting member or the second abutting member, or the mounting hole is arranged on the first abutting member and the second abutting member, the mounting hole corresponds to the position component, the first abutting member or the second abutting member is fixedly connected to the second outside surface of the sheet by an engagement of the mounting hole and the positioning component, or the first abutting member and the second abutting member are fixedly connected to the second outside surface of the sheet by the engagement of the mounting hole and the positioning component.

9. The device of claim 8, wherein the device further comprises a locking component, the locking component locks both the sheet and the first abutting member, or the locking component locks both the sheet and the second abutting member, or the locking component locks the sheet, the first abutting member and the second abutting member, and an end of the positioning component is connected to the locking component, and the end of the positioning component abuts against the first abutting member or the second abutting member, or the end of the positioning component abuts against the first abutting member and the second abutting member, the positioning component passes through the mounting hole.

10. The device of claim 9, wherein the end of the positioning component is provided with a threaded section, the positioning component passes through the mounting hole, and the locking component is a screw, and the screw is threadably connected to the threaded section.

11. The device of claim 1, wherein the device further comprises a connecting structure for connecting with another sheet, and the connecting structure is disposed on the first abutting member or the second abutting member, or the connecting structure is disposed on the first abutting member and the second abutting member.

12. The device of claim 11, wherein the connecting structure comprises:

a connecting installation slot, the connecting installation slot is disposed on the first abutting member or the second abutting member, or the connecting installation slot is disposed on the first abutting member and the second abutting member;

a connecting component, the connecting component is rotatably disposed in the connecting installation slot, and the connecting component comprises a connecting portion and a holding portion, the connecting portion rotatably protrudes from the connecting installation slot, and the holding portion is connected to the connecting portion;

a fixing component, a first end of the fixing component is connected to the connecting component, and a second end of the fixing component is connected to the first abutting member or the second abutting member, or the second end of the fixing component is connected to the first abutting member and the second abutting member; the connecting component is fixedly arranged in the connecting installation slot;

a connecting part, the connecting part is disposed on the first abutting member or the second abutting member, or the connecting part is disposed on the first abutting member and the second abutting member, the first abutting member or the second abutting member corresponds to another sheet, or the first abutting member and the second abutting member correspond to the first sheet, the connecting part is connected with the connecting portion.

13. The device of claim 1, wherein the device comprises at least three abutting members, and a width of a middle abutting member is equal to a sum of widths of two side abutting members, the two side abutting members are located on both sides.

14. The device of claim 1, wherein the device comprises at least four abutting members, and widths of two middle abutting member are equal to a sum of widths of two side abutting members, the two side abutting members are located on both sides, and the two middle abutting members have a same width.

15. An LED module, comprising a PCB, LEDs, a mask, and a device for bending a sheet, wherein the PCB comprises a first outside surface and a second outside surface, the second outside surface of the PCB is opposite to the first outside surface of the PCB; the LEDs are disposed on the first outside surface of the PCB; the mask is disposed on the first outside surface of the PCB, and the mask covers the PCB and sides of the LEDs; and the device comprises at least two abutting members respectively fixed to at least two portions of the second outside surface of the PCB, an angle is formed between the at least two abutting members, the at least two abutting members are moveable relative to each other such that the angle is adjustable between a desired range and the at least two portions are bent according to the angle, wherein the at least two abutting members comprise a first abutting member and a second abutting member rotatably connected to the first abutting member; and wherein a rotating position and a locking position are provided at a connection of the first abutting member and the second abutting member, the first abutting member and the second abutting member are capable of rotating relative to each other at the rotating position, and the first abutting member and the second abutting member are capable of being interlocked with each other at the locking position so as to obtain a desired curvature of the PCB.

16. The LED module of claim 15, wherein the PCB is fixed on the at least two abutting members by a glue or a hook.

* * * * *